United States Patent
Wissel

(10) Patent No.: US 7,930,663 B2
(45) Date of Patent: Apr. 19, 2011

(54) STRUCTURE FOR INTEGRATED CIRCUIT FOR MEASURING SET-UP AND HOLD TIMES FOR A LATCH ELEMENT

(75) Inventor: Larry Wissel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 12/111,609

(22) Filed: Apr. 29, 2008

(65) Prior Publication Data

US 2008/0201675 A1    Aug. 21, 2008

Related U.S. Application Data

(63) Continuation-in-part of application No. 11/532,252, filed on Sep. 15, 2006, now abandoned.

(51) Int. Cl.
*G06F 17/50*     (2006.01)
(52) U.S. Cl. .................... 716/108; 716/101; 716/106
(58) Field of Classification Search .................. 716/101, 716/106, 108
See application file for complete search history.

(56) References Cited

U.S. PATENT DOCUMENTS

| | | | |
|---|---|---|---|
| 5,404,311 A | 4/1995 | Isoda | |
| 6,090,150 A | 7/2000 | Tawada | |
| 6,311,148 B1 | 10/2001 | Krishnamoorthy | |
| 6,348,826 B1 | 2/2002 | Mooney et al. | |
| 6,378,113 B1 | 4/2002 | Levitsky et al. | |
| 6,421,801 B1 | 7/2002 | Maddux et al. | |
| 6,456,560 B2 | 9/2002 | Arimoto et al. | |
| 6,640,330 B1 | 10/2003 | Joshi | |
| 6,732,066 B2 | 5/2004 | Krishnamoorthy | |
| 6,904,579 B2 | 6/2005 | Katla et al. | |
| 7,007,215 B2 | 2/2006 | Kinoshita et al. | |

*Primary Examiner* — Sun J Lin
(74) *Attorney, Agent, or Firm* — Scully, Scott, Murphy & Presser, P.C.; Richard M. Kotulak, Esq.

(57) ABSTRACT

A design structure for an integrated circuit (IC) includes circuitry for measuring accurately at least one of set-up and hold times of a flip-flop included in the IC design. The circuitry uses data determined at the location of the flip-flop in the IC, and includes a first delay element driven by a first clock and configured to supply a zero-delay value of the first clock to a first flip-flop. The circuitry also includes a second delay element having a selectable delay, the second delay element configured to supply a first delayed version of the first clock to a second flip-flop, wherein an output of the first flip-flop is coupled to an input of the second flip-flop. A third delay element has a selectable delay and is coupled in series with the second delay element to supply a second delayed version of the first clock to a third flip-flop, and an output of the second flip-flop is coupled to an input of the third flip-flop. The second delayed version of the clock signal drives the third flip-flop to monitor the second flip-flop delay, the possible "pass set-up" state, and "pass hold" state outputs are determined for the second flip-flop based on a final test state of the second and third flip-flops.

13 Claims, 3 Drawing Sheets

STRUCTURE FOR INTEGRATED CIRCUIT FOR MEASURING SET-UP AND HOLD TIMES FOR A LATCH ELEMENT

RELATED APPLICATION

This application is a continuation-in-part of prior U.S. patent application Ser. No. 11/532,252, filed Sep. 15, 2006, now abandoned.

BACKGROUND OF THE INVENTION

1. Field of the Invention

The present invention relates to latch elements and flip-flops. More particularly, the invention relates to a design structure for flip-flops used in shift register operation that allows for accurate measurement of set-up and hold times at the flip-flop on-chip locations.

2. Description of the Related Art

The skilled artisan understands the importance of knowing flip-flop set-up and hold times when timing an integrated circuit or chip. Set-up time is particularly important for systems, e.g., system on chip (SOC), operating at a very high frequency (e.g., in a shallow pipelines). At very high switching speeds or operating frequencies, set-up time is or may be an appreciable part of the clock or latch cycle. Hold times are important at any frequency because clock skew often forces a large amount of delay padding on short paths to eliminate design-killing hold-time fails. Today, as IC manufacturers continue to increase the operating frequencies of their devices, IC test platforms and systems must improve speed. Conventional technologies provide systems that can test at upwards of 400 MHz base rates, generating test vectors and comparing device output data at such speeds. Such conventional techniques that include generating test vectors, or measuring outputs at extremely high device I/O switching speeds are critically dependent on fixturing. Known conventional techniques, however, cannot access outputs at on-chip IC locations, for example, measuring set-up and hold times directly at a flip-flop output pin.

The predominant conventional application for determining set-up and hold times to determine on-chip flip-flop delay for use by IC designers is Spice. The Spice platform provides various simulation techniques whereby flip-flops and their set-up and hold time delays are simulated. Functionally, Spice moves the clock and data inputs to a flip-flop (latch) progressively closer in time while observing or tracking delay increase. The clock-data separation that causes a tolerable delay increase is declared to be the set-up time (or hold time). This approach is suspect because the cause of the delay increase is that the flip-flop is spending extra time near the metastable point. At the metastable point, both nodes of a flip-flop are near 0.5*Vdd. With low-Vdd technologies, this value is near the transistor threshold, Simulation models emphasize accuracy at high overdrive conditions, but are far less accurate at such low overdrive.

As mentioned above, attempts to directly measure set-up and hold times with clock and data input pins to a chip are unlikely to be accurate. Signals directed to or emanating from an on-chip flip-flop cannot be observed with conventional hardware and software systems. Consequently, there are large and varying fixturing delays, and uncertain silicon latencies between the IC pins and the on-chip flip-flop. Often the signal edge resolution of test equipment operating at high frequencies is not insignificant compared to the set-up or hold time being measured. That is, when using conventional fixturing techniques and devices to detect or determine IC flip-flop set-up and hold times the entire test-signal path length and the signal's round trip delay (RTD) must be included in calculations.

Various technologies are known that provide processes and circuits for addressing IC design issues relating to delay broadly, and limitations imposed on high frequency operation in view of flip-flop set-up and hold time delay, particularly in shallow pipeline operation. For example, U.S. Pat. No. 5,404,311 discloses processes and apparatus for evaluating delay in an internal logical pathway by comparison of times a signals is required to traverse similar combinational logic paths. By comparison, the inventions determine the maximum operating frequency of a set of combinational logic paths. U.S. Pat. No. 5,403,311, however, does not "measure" set-up and hold times for latches within same set of paths to support the comparisons. Comparisons may not provide the most accurate delays at the latch of interest.

U.S. Pat. No. 6,090,150 discloses techniques for determining skew of the clock tree, and delay margin of combinational logic paths in an IC. The techniques utilize the clock tree skew, and logic path delay margin to selectively add delay to the clock tree to enable faster system operation. The techniques, however, did not investigate latches or flip-flops. U.S. Pat. No. 6,090,150 does not address the problems addresses herein the instant inventions by its circuitry that accurately measures latch element operation.

U.S. Pat. No. 6,311,148 uses simulations to measure clock and data delays. The techniques disclosed use the measured clock and data delay information gathered during simulation to extract or generate set-up and hold times. That is, the generated set-up and hold times are determined by subtraction of values from the simulation-derived values. While the patented processes or techniques may be implemented in code, any hardware implementation (for faster speed of operation) would be quite limited for at least the reason that the end points of the delay measurements are not observable directly, or accessible in hardware (a circuit). While concern for delay, and delay changes, is clearly evidenced, the techniques do not attempt characterize delay change by evaluation, or characterization of set-up and/or hold times. The techniques, whether implemented in code, or in hardware circuitry, or using simulation programs, do not investigate whether any limitations detected are related to latch or flip-flop set-up and hold times, or violations of such set-up and hold times.

U.S. Pat. No. 6,348,826 discloses a circuit referred to therein as a "phase interpolator" circuit. The phase interpolator circuit is understood to allow a phase of a clock signal to be changed in small, high-precision steps. The ability to make such clock adjustments enables timing optimization of strobe signals used in high-speed interconnect schemes. The patent's disclosure does not suggest or teach circuitry for analyzing set-up and hold times for on-chip latches (flip-flops).

U.S. Pat. No. 6,378,113 is directed to the use of simulations to measure clock and data delays within integrated circuits. As understood, the inventive processes disclosed extract or detect latch or flip-flop set-up times (but not hold times) from simulation data. As mentioned above, the set-up and hold times for latch elements operating on-chip in an IC are determined by software simulation, such as provided by Spice. The inventive processes are believed to be limited to software implementations because of inherent limitations for implementing such a technique in hardware. That is, by virtue of IC location, end points of delay measurements at internal latches are not observable (detectable) directly. The disclosed processes do not use or look to set-up or hold time violations to estimate delay changes.

U.S. Pat. No. 6,421,801 refers to "set-up and hold time" within IC designs as a concept. The phrase "set-up and hold times" as used in the referenced patent appear to be used to characterize and explain processes which may be applied to different levels of assemblies in an IC, with substantially different meaning. That is, "set-up and hold time" is not used in the referenced patent to refer to the narrow timing window near a flip-flop clock edge, the focus of the instant inventions. The present inventions' use of the phrase "set-up and hold time" herein refers to a narrow window of time in a latch cycle, wherein the flip-flop may not function properly. Set-up and hold time windows as used in the instant inventions, as distinguished from the disclosure found in U.S. Pat. No. 6,421,801, do not relate to solving design problems concerned with accurately measuring flip-flop or latch clock-cycle time per se, but on a single edge of the clock signal driving a latch or flip-flop.

U.S. Pat. No. 6,456,560 discloses a circuit that measures set-up and hold times, and includes a variable delay line for testing IC design circuitry. The variable delay line allows for evaluating set-up and hold times by changing the delay line setting and observing the behavior of the other circuitry under evaluation. The use of the phrase, or definition of "set-up and hold time" appears to relate to the set-up and hold times of a memory chip, not a flip-flop or latch. U.S. Pat. No. 6,456,560, does not appear to include circuitry capable of determining accurately set-up and hold times in latches or flip-flops comprising ICs, used for high-frequency pipelining.

U.S. Pat. No. 6,440,330 teaches a process which uses simulations to measure delays, to extract set-up and hold times from data realized from the simulations. The techniques disclosed appear to be implementable in software rather than hardware. The end points of the delay measurements are not observable in hardware, and therefore any software technique suffers from this hardware limitation.

U.S. Pat. No. 6,732,066 is similar, and commonly owned with U.S. Pat. No. 6,311,148. The patent references disclose the use of simulations to simulate or estimate clock and data delay information gathered during simulation. The generated set-up and hold times are determined by subtraction of simulation values from other the simulation-derived values. Simulation-generated or estimated set-up and hold time limitations may not be sufficiently accurate for all designs, particular those relying on high frequent shallow pipelining. Moreover, while the patented processes or techniques may be implementable by software, any hardware implementation, which would of course be much faster, would be quite limited for at least the reason that the end points of the delay measurements are not observable, or accessible in hardware (other than by use of simulation). While concern for delay, and delay changes, is clearly evidenced, the techniques do not attempt characterize delay change by physical evaluation, and whether detected limitations or simulations based on set-up and hold times in a flip-flop or latch are violated.

U.S. Pat. No. 6,904,579 discloses the use of simulations to measure delays, and to extract set-up and hold times from data derived during the simulations. The invention appears to be implementable in software, and not hardware, because the end points of the delay measurements are not observable in hardware. Attempts to measure delay using hardware circuitry would be much faster than software implementations of the same tasks, but limited for at least the reason that the end points of the delay measurements are not observable, or accessible in hardware (a circuit) directly. While concern for delay, and delay changes, is clearly evidenced, the techniques do not attempt characterize delay change by physical evaluation, and do not include a process or sub-process by which setup and hold times in a particular flip-flop or latch are violated, with respect to inherent delay.

U.S. Pat. No. 7,007,215 relates to a circuit that attempts to accurately measure set-up and hold times and through the use of a variable delay line. The circuitry relies on two edges generated with high precision test equipment. The disclosure appears to utilize the expression "set-up and hold time" as a time reference relating to the set-up and hold times of a memory chip, not the set-up and hold times of latches or flip-flops within an IC, or circuitry for determining the set-up and hold times for on-chip latches accurately, particularly for high speed shallow pipelining. That is, high-speed test equipment may influence the accuracy of estimated, simulated, set-up and hold time delays, or same determined using a text fixture (at pin measurements).

None of the above-mentioned conventional circuitry and processes suggest attempting to measure latch delay, accurately, at the on-chip latch location. That is, conventional processes are critically dependent on fixturing and simulations, which do not provide for direct set-up and hold measurement for flip-flops or latches used for pipelining, but merely estimate, or predict, which estimates and predictions cannot be relied upon in all cases, particularly during operation under environmental conditions that could influence, or modify the latch element metastability point (see details below), during high speed operation.

SUMMARY OF THE INVENTION

To that end, the invention described and set forth herein comprises a design structure for manufacturing an integrated circuit (IC) that includes flip-flops used in shift register operation that allows for accurate measurement of set-up and hold times at the flip-flop on-chip locations using a single clock, with only one non-critical edge applied to a pin of the IC, and related design flow method. Integrated circuits and the latches or flip-flops manufactured in accordance with the inventive design structure allows for direct set-up and hold time measurement at on chip locations. Direct measurement obviates the need for fixturing to accurately measure flip-flop (or latch) set-up and hold time normally used for critical on-chip applications, such as shallow data pipelining.

In one embodiment, the invention comprises design structure for manufacturing an integrated circuit (IC) with flip-flops for use in shift-register operation whose set-up and hold times may be measured directly. That is, during testing operation a single clock edge generates precision delays (on-chip), which delays are measurable directly. The precision delay testing does not rely on high-resolution edges used with conventional test equipment, carefully calibrated fixturing (and inherent delays) or on-chip insertion delays. The inventive design structure and integrated circuitry manufactured thereby may be set with a digital bit to perform either a Set-up or a Hold test. A first delay value is set with digital bits, and after four clock pulses (with non-critical timing), the circuitry generates a digital Pass/Fail indicator for the operation being measured. All signals (including the clock signal) can be shared with other circuit blocks in a design structure. Hence the cost for implementing the novel on-chip devices for measuring flip-flop set-up and hold times is very low.

BRIEF DESCRIPTION OF THE DRAWINGS

The foregoing and other objects, aspects and advantages will be better understood from the following detailed description of embodiments of the inventions, with reference to the drawings, in which.

DETAILED DESCRIPTION OF THE PREFERRED EMBODIMENT(S) OF THE INVENTION

The inventive methods, software and apparatus set forth herein are disclosed and described in order to convey the broad inventive concepts, claims to which are appended hereto. The drawings and descriptions are not meant to in any way limit the scope and spirit of the inventions, as claimed.

Figure 1A:
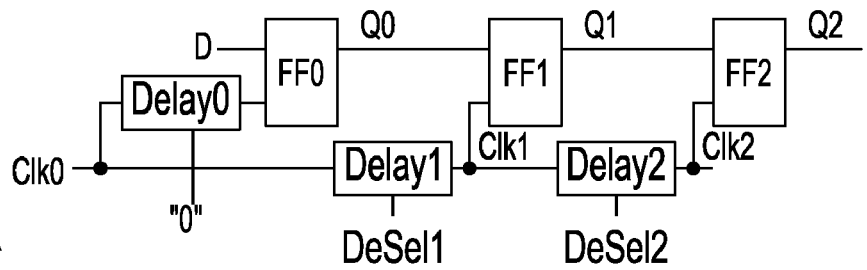
FIG. 1A is a logical circuit diagram of one embodiment of the present invention.
Figure 1B:
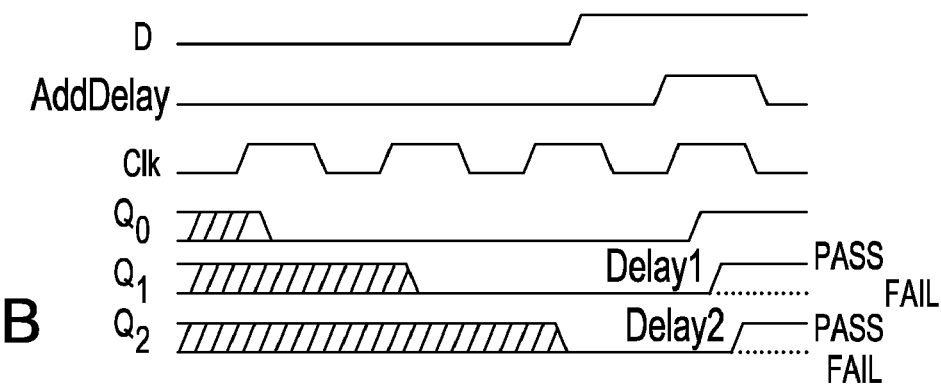
FIG. 1B is a timing diagram associated with operation of the logic circuitry shown in FIG. 1, which timing diagram depicts the timing of signals required to implement a set-up test in the FIG. 1A circuitry.

The reader is referred first to the logic circuit diagram of FIG. 1A. The logical circuit is constructed to enable determining a set-up time for flip-flop (FF1). Flip-flop set-up is the delay required for flip-flop set-up, or transition form 0 to 1, or 1 to 0. The inventive circuitry determines the flip-flop delay essentially "at" the physical location of FF1 in the IC of FIG. 2A. The logical circuitry determines the set-up time delay by adding delay to FF1 using the AddDelay signal as shown in FIG. 1B (when the polarity of the D input is 1). The AddDelay signal switches the delays in.

The set-up test thereby exactly or substantially exactly determines a delay, or aggregate delay, that is equivalent to the set-up time for FF1. The technique determines when the set-up time for FF1 is violated. To do so, the digital delay control bits (not shown in FIG. 1A) are set to 0 to define Delay1 and Delay2 as 0, or a minimum delay value. With Delay1 and Delay2 defined by respective 0-bit inputs, there is no added delay (however, there may be an inherent delay), to which the delays of Delay1 or Delay2 are added. Delay1 and Delay 2 are added after three clock cycles (AddDelay signal) as Q0, Q1, and Q2 are initialized to the same value with a single clock input (Clk0), during normal "shift register" operation (D=1). Delay0 is permanently set to match the minimum delay of Delay1.

After the three initialization clock pulses (FIG. 1B), the AddDelay signal is asserted to change the timing. Before that time, the FF1 is operating at its inherent delay. AddDelay adds Delay1 and Delay2, which may be set to minimal non-zero delay outputs or values on the next clock cycle. The next clock cycle (the fourth in the timing of FIG. 2A) is the clock cycle during which the Set-up test is performed. Q0 changes state due to the change on D, and Clk1 is delayed from Clk0. For small values of Delay1, Clk1 will still have adequate time with respect to the change of Q0, and FF1 will capture the value of Q0 from the third clock cycle ("Fail" value of Q1 in FIG. 2A). But as Delay1 is increased, the time will first be invalid. As Delay1 is increased further, Clk1 will satisfy the set-up time with regard to the new cycle-four value of Q0. A simple interpretation is that Clk1 will look like a future clock edge with regard to the transition on Q0, and that Clk1 will capture the new (cycle four) value of Q0 into FF1. This is the "Pass" value of Q1 in FIG. 1C.

Figure 1C:
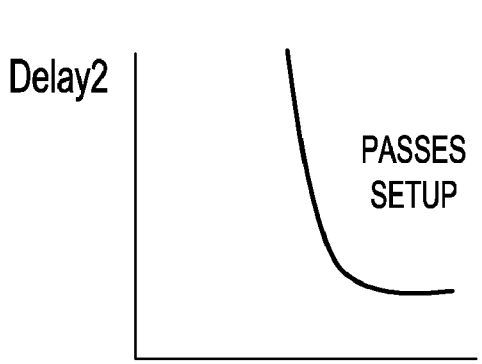
FIG. 1C is a graphical representation of a locus of Delay1, and Delay2 values, which Delay1 and Delay2 values satisfy the set-up criteria associated with the logic and timing of FIGS. 1A and 1B.

The purpose of FF2 and Clk2, with respect to the FIG. 1B timing, and the FIG. 1C pass/fail diagram, is to monitor the change in delay of FF1 as its Set-up time is violated. For small values of Delay2, FF2 will always capture the cycle-three value of Q1 ("Fail" on Q2 in FIG. 2; once again, this is a set-up test). For large values of Delay2, Clk2 will be delayed from Clk1 enough that it also looks like a "future edge" with respect to the transition of Q1. FF2, therefore, will capture the new value of Q1 ("Pass" on Q2 in FIG. 1C). Delay2 has to match the Clk-Q delay of FF1 in order to capture the transition of FF1. If FF1 Clk-Q delay increases because FF1 clock (Clk1) and data (Q0) do not satisfy the Set-up time, then Delay2 will have to be increased for FF2 to capture the new value of Q1.

The "Pass SetUp" (polarity=1) condition is based on the final state of both Q1 and Q2 (FIG. 1C). More particularly, Q1 and Q2 will both be high only if Delay1 and Delay2 have proper values to capture the transitions of Q0 and Q1 into FF1 and FF2, respectively. FIG. 1C shows the locus of (Delay1, Delay2) values that separate "Pass" (both) regions from "Fail" (either) regions.

Figure 2A:
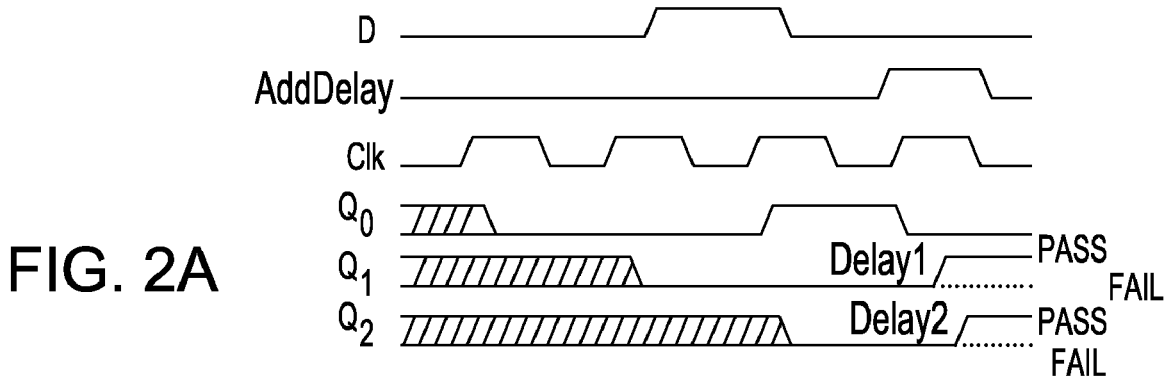
FIG. 2A is a timing diagram associated with the hold-time test for the logical circuit of FIG. 1A.

The flip-flop "hold test" (polarity=0) is very similar to the set-up delay test, initiated if the polarity input is zero (0). For the hold test, the bits Delay1 and Delay2 are set to zero (no "added" delay-only inherent delay) for three clock cycles as Q0, Q1, and Q2 are initialized in normal "shift register" operation. The timing for the hold-test implementation is shown in FIG. 2A. After the three initialization clock pulses, the AddDelay signal is asserted to perform the Hold test on the fourth cycle. For small values of Delay1, Clk1 will have adequate hold time before the change of Q0, and FF1 will capture the value of Q0 from the third clock cycle ("Pass" value of Q1 in FIG. 2B). But as Delay1 is increased, the hold time will become invalid and ultimately FF1 will capture the cycle-four value of Q0 ("Fail" value in FIG. 2B).

Again, FF2 and Clk2 monitor the change in delay of FF1 as its Hold time is violated. For small values of Delay2, FF2 will always capture the cycle three value of Q1 ("Pass" on Q2 in FIG. 2B). For large values of Delay2, Clk2 will be delayed from Clk1 enough that it also looks like a "future edge" with respect to the transition of Q1, and FF2 will capture the cycle-four value of Q1 ("Fail" on Q2 in FIG. 1B). Delay2 has to match the Clk-Q delay of FF1 in order to capture the transition of FF1. If FF1 Clk-Q delay increases because FF1 clock (Clk1) and data (Q0) do not satisfy the Hold time, then Delay2 will have to be increased for FF2 to capture the new value of Q1. The "Pass Hold" condition is based on the final state of both Q1 and Q2. They will both be high only if Delay1 and Delay2 have proper values to capture the transitions of Q0 and Q1 into FF1 and FF2, respectively. FIG. 2C shows the locus of (Delay1, Delay2) values that separate "Pass" (both) regions from "Fail" (either) regions.

A small amount of additional logic is required to implement this as a self-contained experiment with a Pass-Fail output. The "Pass" output is established with the following logic interrogated after the fourth clock:
PassSetUp=Q0.Q1.Q2+Q0'.Q1'.Q2'
PassHold=Q0'.Q1.Q2+Q0.Q1'.Q2'
Pass=TestSetUp.PassSetUp+TestSetUp'.PassHold A four-state state machine will control this logic. The simplest form may include, for example, four state registers S[3:0] that are initialized to 0000, and are incremented through 0001, 0010, 0100, 1000 for the four cycles. The DataIn to Q0 can be generated simply as D=TestSetUp. (Test1.S2+Test1'.S2')+TestSetUp'.[Test1.S1.S2'+Test1'. (S1.S2')'], where "Test1" is an input that is asserted when desiring to measure the set-up or hold time with D=1, and "Test1" is an input that is asserted when desiring to measure the set-up or hold time with D=0. The reader should note that as used herein, "'" at the end defines the "complement" of the logical operator or word. For example, Test SetUp' is the complement of TestSetUp. TestSetUp is an input to select the set-up test, and SetUpTest' is an input to implement the hold test. The AddDelay signal resides in the S3 register.

Figure 2B:
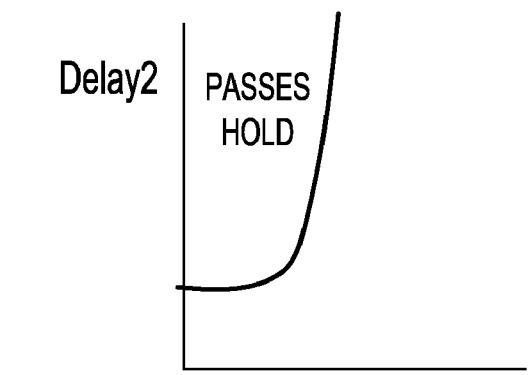
FIG. 2B is a graphical representation of a locus of Delay1, and Delay2, which values satisfy the hold-time criteria associated with the logic and timing of the inventive circuitry comprising FIGS. 1A and 2A, respectively.
Figure 2C:
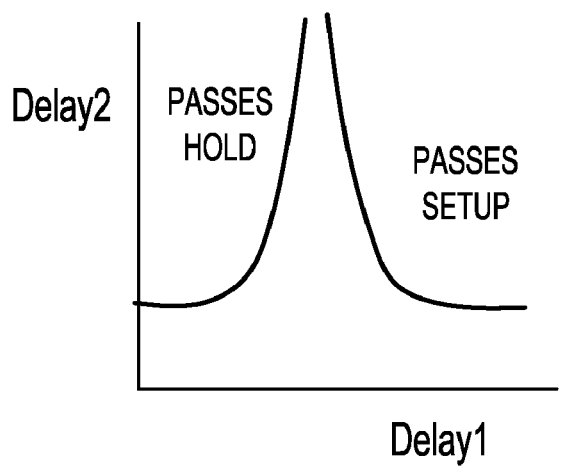
FIG. 2C is a combination of the limitations shown in FIGS. 1C and 2B, which describes the set-up and hold characteristics relating to the inventions disclosed herein.
Figure 3A:
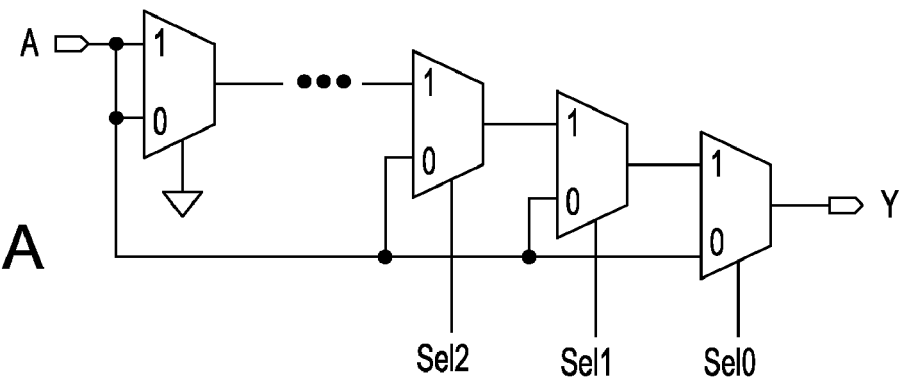
FIG. 3A is a circuit diagram of a coarse delay line.
Figure 3B:
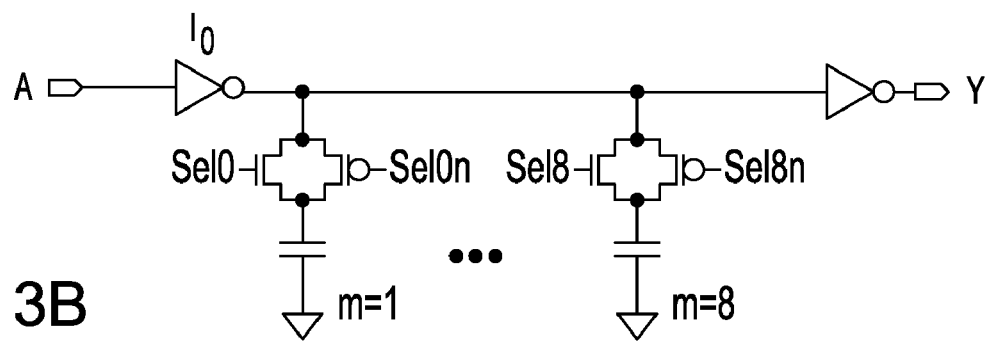
FIG. 3B is a fine delay line.

Delay2 of FIGS. 1C and 2B can be combined as shown FIG. 2C to fully describe the Set-up and Hold characteristics of FF1: Delay lines: Delay1 and Delay2 are set by on-chip delay lines with digital inputs. Each delay line should be a combination of coarse delay and fine delay, with the fine delay adjustment range equal to the smallest step of the coarse delay. Such delay lines are well known in the industry, with the circuit model shown in FIG. 3A representative of coarse delay, and the circuit model shown in FIG. 3B representative of fine delay.

Figure 3C:
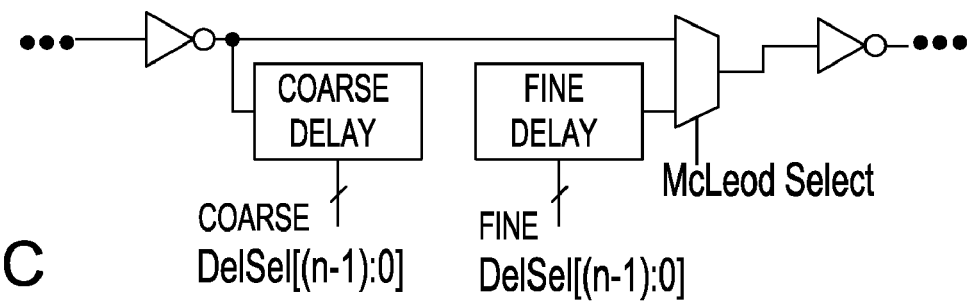
FIG. 3C is a portion of a McLeod loop, showing how different circuit paths can be selected in order to measure the delay difference between them.

An essential element for success for such a technique is the accurate knowledge of Delay1 and Delay2. That is, even for a fixed digital select value, these delays, that is, Delay1 and Delay2, will change with Vdd and temperature, and will certainly vary lot-to-lot and die-to-die. So it essential to include a measurement circuit. A ring oscillator with a McLeod loop of FIG. 3C is one example of a circuit that could serve this inventive purpose. For that matter, the delay line in the McLeod loop can be a replica of the delay line in the set-up and hold experiment. The skilled artisan will note, however, that although the use of a replica introduces uncertainty about the tracking of the line in the experiment, and the replica line in the loop. This uncertainty can be reduced by:

1. making the lines out of large circuits (large transistor area to reduce implant dose statistical uncertainty, and multiple-finger transistors to reduce Lpoly variation);

2. introducing additional multiplexing into the inventive circuitry, such as the FIG. 1 model, such that the delay lines used in the Clk1 and Clk2 paths are also in McLeod loops (no replicas).

Figure 4:
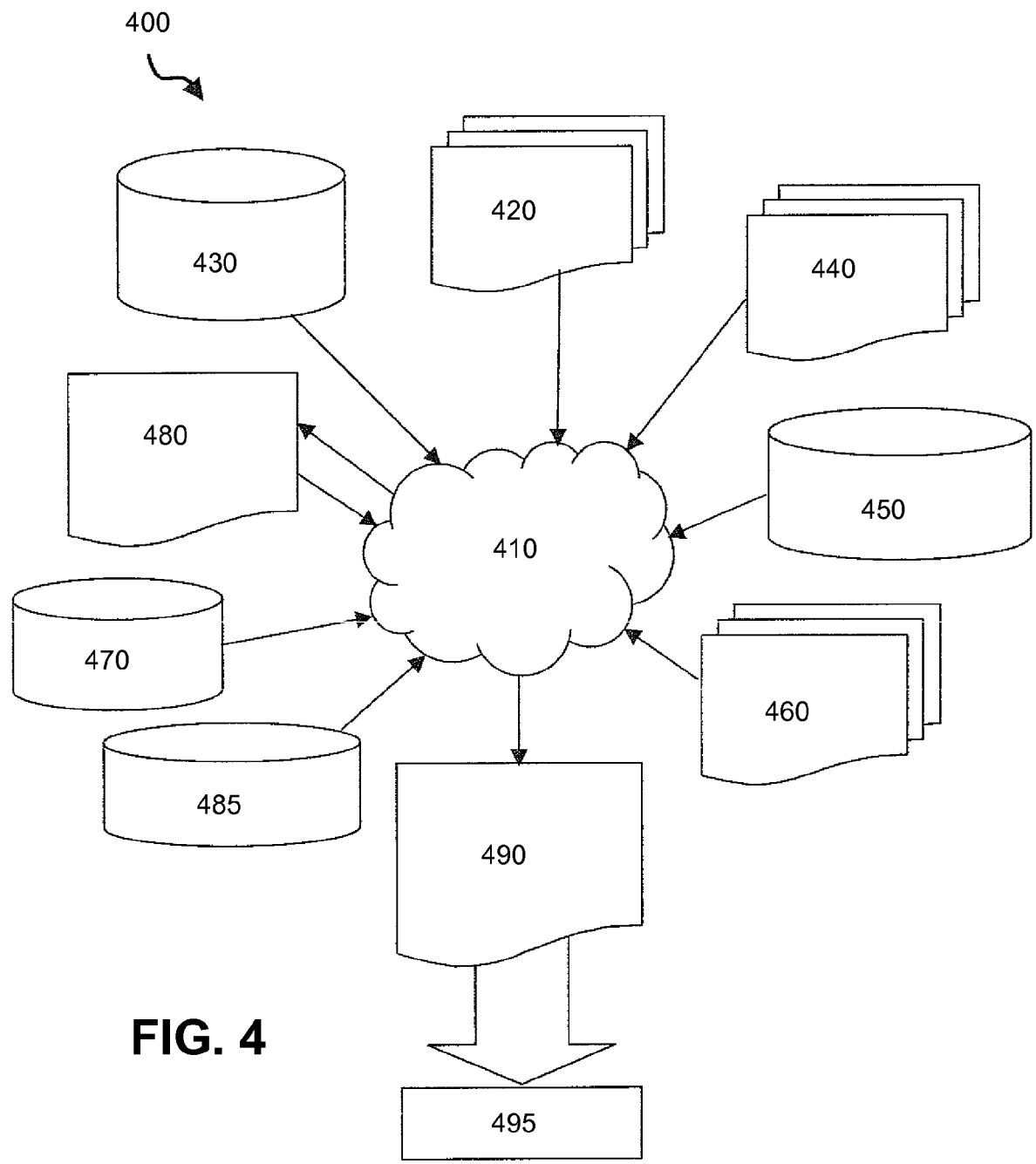
FIG. 4 is a flow diagram of a design process used for semiconductor design, manufacture and/or testing of ICs with flip-flops for use in shift-register operation the set-up and hold times of which are directly measured.

FIG. 4 shows a block diagram of an exemplary design flow 400 used for example, in semiconductor design, manufacturing, and/or test. Design flow 400 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 comprises an embodiment of the invention as shown in FIG. 1A in the form of schematics or HDL, a hardware-description language (e.g., Verilog, VHDL, C, etc.).

Design structure 420 may be contained on one or more machine readable medium. For example, design structure 420 may be a text file or a graphical representation of an embodiment of the invention as shown in FIG. 1A. Design process 410 preferably synthesizes (or translates) an embodiment of the invention as shown in FIG. 1A into a netlist 480, where netlist 480 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 480 is resynthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 90 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the invention. The design structure of the invention is not limited to any specific design flow.

Design process 410 preferably translates an embodiment of the invention as shown in FIG. 1A, along with any additional integrated circuit design or data (if applicable), into a second design structure 490. Design structure 490 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 490 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1A. Design structure 490 may then proceed to a stage 495 where, for example, design structure 490: proceeds to tape-out, is released to manufacturing, is released to a mask house, is sent to another design house, is sent back to the customer, etc.

It will be recognized that there are many variations possible to implement the invention as a design structure, design process or method, and integrated circuitry that comprises flip flops with a capability of accurately measuring delay in the flip-flop or latch element, and communicate same delay information to support broad IC operation, e.g., shallow pipelining at very high frequency or data rates. Consequently, the examples listed above are illustrative, and not meant to be exhaustive.

The invention claimed is:

1. A design structure embodied in a machine readable medium, said machine readable medium readable by an electronic design automation tool, and said machine readable medium including instructions for execution by the electronic design automation tool in a design process for producing the design structure, the design structure comprising an integrated circuit (IC) that includes circuitry for measuring accurately at least one of set-up time and hold time of a flip-flop included in the IC at a physical location of said flip-flop, the circuitry comprising:

a first delay element driven by a first clock and configured to supply a minimal delay or default delay value to a clock input of a first flip-flop having a data value D applied at an input thereof;

a second delay element having a selectable delay and configured to supply a first delayed version of the first clock to a second flip-flop, wherein an output Q0 of the first flip-flop is coupled into the second flip-flop; and a third delay element having a selectable delay and coupled in series with the second delay element to supply a second delayed version of the first clock to a third flip-flop, and an output Q1 of the second flip-flop is coupled to an input of the third flip-flop;

wherein the second delayed version of the first clock drives the third flip-flop to monitor delay of the second flip-flop, and wherein possible "pass set-up" state, and "pass hold" state output determined for the second flip-flop based on a final test state of the second and third flip-flops.

2. The design structure as set forth in claim 1, wherein the second flip-flop is instrumental for high frequency latching operation in shift registers.

3. The design structure as set forth in claim 1, wherein the final test state is determined by logical elements interrogated after a fourth clock cycle in accordance with the following logical rules:

PassSetUp=Q0.Q1.Q2+Q0'.Q1'.Q2'
PassHold=Q0'.Q1.Q2+Q0.Q1'.Q2'
Pass=TestSetUp.PassSetUp+TestSetUp'.PassHold;

wherein the Q0,Q1,Q2 are respective outputs of said first, second, and third flip-flops respectively, and Q0', Q1' and Q2' are respective complementary outputs of said first, second and third flip-flops, respectively, and, Pass is an output established by logic whereby asserting TestSetUp value selects SetUp test and asserting TestSetUp' value selects Hold test, wherein the TestSetUp' is a complement of TestSetUp.

4. The design structure as set forth in claim 3, wherein a four-state state machine controls the logical rules.

5. The design structure as set forth in claim 4, wherein the four-state state machine comprises four (4) state registers, SN, where N is 0, 1, 2 or 3.

6. The design structure as set forth in claim 5, wherein a data input, D, to said first flip-flop outputting Q0 may be generated according to logic:

D=TestSetUp.(Test1.S2+Test1'.S2')+TestSetUp'. [Test1.S1.S2'+Test1'.(S1.S2')'], where Test1 is an input value asserted to determine the SetUp or Hold time when D=1, Test1' is an input value asserted to determine the SetUp or Hold time when D=0, and S1 and S2 are state registers having values, and S2' is a complementary value of S2, and wherein an AddDelay value asserted for changing timing of said second and third delay element is included in the S3, or fourth state register.

7. The design structure as set forth in claim 6, wherein each set-up and hold test is initiated with a state of one digital bit, delays are set with digital bits, and a pass result or fail result for a set delay may be realized after four (4) clock cycles.

8. The design structure as set forth in claim 1, the first delayed version and the second delayed version are set with on-chip delay lines having digital inputs.

9. The design structure as set forth in claim 8, wherein each line corresponding to each of the first delayed version and the second delayed version comprises a combination of a course delay and a fine delay.

10. The design structure as set forth in claim 9, wherein the course and fine delays include a ring oscillator and McLeod loop.

11. The design structure as set forth in claim 10, wherein the McLeod loop is a replica of SetUp and Hold means in a logical circuit.

12. The design structure as set forth in claim 1, wherein the design structure comprises a netlist.

13. The design structure as set forth in claim 1, wherein the design structure resides on a storage medium as a data format used for in exchange of layout data of integrated circuits.

* * * * *